(12) United States Patent
Manku (10) Patent No.: US 8,811,538 B1
(45) Date of Patent: Aug. 19, 2014

(54) IQ ERROR CORRECTION

(71) Applicant: Research in Motion Limited, Waterloo (CA)

(72) Inventor: Tajinder Manku, Waterloo (CA)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 13/832,432

(22) Filed: Mar. 15, 2013

(51) Int. Cl.
*H03D 3/00* (2006.01)

(52) U.S. Cl.
USPC .......................................................... 375/322

(58) Field of Classification Search
CPC ................... H04L 2027/0024; H04L 27/3863; H04L 27/22; H03D 3/007
USPC ..................... 375/322, 297, 324, 340; 330/52; 455/231.1, 344
See application file for complete search history.

(56) References Cited

U.S. PATENT DOCUMENTS

| | | | |
|---|---|---|---|
| 5,726,597 A | 3/1998 | Petty et al. | |
| 5,749,051 A | 5/1998 | Dent | |
| 6,242,963 B1 | 6/2001 | Su et al. | |
| 6,590,438 B1 | 7/2003 | Manku et al. | |
| 6,639,446 B2 | 10/2003 | Komurasaki et al. | |
| 6,859,085 B2 | 2/2005 | Watanabe et al. | |
| 6,941,121 B2 | 9/2005 | Chen | |
| 7,006,447 B1 | 2/2006 | Vaisanen et al. | |
| 7,164,901 B2 | 1/2007 | Zheng et al. | |
| 7,171,185 B2 | 1/2007 | Matsumoto et al. | |
| 7,203,476 B2 | 4/2007 | Ruelke et al. | |
| 7,218,163 B2 | 5/2007 | Hanke et al. | |
| 7,242,910 B2 | 7/2007 | Peterson, III et al. | |
| 7,251,468 B2 | 7/2007 | Ruelke et al. | |
| 7,259,569 B2 | 8/2007 | Kim | |
| 7,292,836 B2 | 11/2007 | Endress et al. | |
| 7,346,134 B2 | 3/2008 | Smith | |
| 7,346,313 B2 | 3/2008 | Cafarella | |
| 7,369,837 B2 | 5/2008 | Kim | |
| 7,415,253 B2 | 8/2008 | Carter et al. | |
| 7,421,260 B2 | 9/2008 | Darabi | |
| 7,421,263 B2 | 9/2008 | Kim et al. | |
| 7,440,742 B1 | 10/2008 | Tsai et al. | |
| 7,447,490 B2 | 11/2008 | Kuo et al. | |
| 7,450,918 B2 | 11/2008 | Park | |
| 7,457,606 B2 | 11/2008 | Kim | |

(Continued)

OTHER PUBLICATIONS

IQ Imbalance Compensation in OFDMA based WiMAX Digital Receivers Wang Lilei; Xu Huimin, Computer Science and Information Technology, 2008. ICCSIT apos;08. International Conference on Volume , Issue , Aug. 29, 2008-Sep. 2, 2008 pp. 388-392.

(Continued)

*Primary Examiner* — Khai Tran (57) ABSTRACT

In a radio receiver having first and second mixers that mix a received communication signal to produce quadrature I and Q signals, measuring an output value of the I and Q signals. At a programmed processor: evaluating symmetry in the I and Q signals by calculating a symmetry test value; iteratively testing gain and phase shift correction values by applying the gain and phase shift correction values to the I and Q signals to identify a pair of gain and phase shift correction values that produces an improved symmetry test value; selecting the pair of gain and phase shift correction values; and applying the selected pair of gain and phase shift correction values to the I and Q signals from the first and second mixers. This abstract is not to be considered limiting.

20 Claims, 5 Drawing Sheets

(56) References Cited

U.S. PATENT DOCUMENTS

| | | |
|---|---|---|
| 7,477,888 B2 | 1/2009 | Behzad |
| 7,496,340 B1 | 2/2009 | Chen et al. |
| 7,496,343 B2 | 2/2009 | Khorram |
| 7,509,112 B2 | 3/2009 | Fujii |
| 7,519,348 B2 | 4/2009 | Shah |
| 7,522,899 B1 | 4/2009 | He |
| 7,532,563 B1 | 5/2009 | Shirali et al. |
| 7,532,874 B2 | 5/2009 | Muhammad et al. |
| 7,542,100 B2 | 6/2009 | Yee et al. |
| 7,542,751 B2 | 6/2009 | Chiu et al. |
| 7,554,380 B2 | 6/2009 | Embabi et al. |
| 7,567,611 B2 | 7/2009 | Chien |
| 7,570,965 B2 | 8/2009 | Rofougaran |
| 7,773,967 B2 | 8/2010 | Smith |
| 7,787,853 B2 | 8/2010 | Belot et al. |
| 7,869,777 B2 | 1/2011 | Darabi |
| 7,890,078 B2 | 2/2011 | Kluge et al. |
| 7,929,938 B2 | 4/2011 | Sellars et al. |
| 7,945,230 B2 | 5/2011 | Tillman |
| 7,949,313 B2 | 5/2011 | Ridgers et al. |
| 7,965,796 B2 | 6/2011 | Kutz et al. |
| 8,000,676 B2 | 8/2011 | Kim et al. |
| 8,010,077 B2 | 8/2011 | Ivonnet et al. |
| 8,045,943 B2 | 10/2011 | Kaczman et al. |
| 8,060,043 B2 | 11/2011 | Pratt et al. |
| 8,073,078 B2 | 12/2011 | Kaczman et al. |
| 8,107,368 B2 | 1/2012 | Connors et al. |
| 8,112,055 B2 | 2/2012 | Yang et al. |
| 8,112,059 B2 | 2/2012 | Beffa |
| 8,121,571 B2 | 2/2012 | Kushnir et al. |
| 8,149,902 B1 | 4/2012 | Mohindra |
| 8,149,955 B2 | 4/2012 | Tired |
| 8,150,350 B2 | 4/2012 | Pratt et al. |
| 8,150,360 B2 | 4/2012 | Ivonnet et al. |
| 2002/0197975 A1 | 12/2002 | Chen |
| 2003/0143967 A1* | 7/2003 | Ciccarelli et al. ........... 455/232.1 |
| 2003/0206603 A1 | 11/2003 | Husted |
| 2004/0152435 A1 | 8/2004 | Pellat et al. |
| 2004/0259519 A1 | 12/2004 | Su |
| 2005/0110567 A1* | 5/2005 | Rabinovich et al. .......... 330/149 |
| 2005/0130619 A1 | 6/2005 | Hanke et al. |
| 2005/0135521 A1 | 6/2005 | Nemer et al. |
| 2005/0143044 A1 | 6/2005 | Kim |
| 2005/0232377 A1 | 10/2005 | Kutz et al. |
| 2005/0239430 A1 | 10/2005 | Shah |
| 2006/0014515 A1 | 1/2006 | Ruelke et al. |
| 2006/0039506 A1 | 2/2006 | Pierluigi |
| 2006/0094361 A1 | 5/2006 | Darabi |
| 2007/0126491 A1 | 6/2007 | Woo et al. |
| 2008/0116902 A1 | 5/2008 | Kim et al. |
| 2009/0004983 A1 | 1/2009 | Darabi |
| 2009/0068974 A1 | 3/2009 | Smith |
| 2009/0143031 A1 | 6/2009 | Shah |
| 2009/0202022 A1 | 8/2009 | Kaczman et al. |
| 2009/0239495 A1 | 9/2009 | Sellars et al. |
| 2009/0280767 A1 | 11/2009 | Tillman |
| 2009/0325529 A1 | 12/2009 | Yang et al. |
| 2010/0067622 A1 | 3/2010 | Komaili et al. |
| 2010/0093298 A1 | 4/2010 | Pratt et al. |
| 2010/0120369 A1 | 5/2010 | Ko et al. |
| 2010/0167683 A1 | 7/2010 | McMullin et al. |
| 2011/0065412 A1 | 3/2011 | Beffa |
| 2011/0092178 A1 | 4/2011 | Wang |
| 2011/0128992 A1 | 6/2011 | Maeda et al. |
| 2011/0151792 A1 | 6/2011 | Kushnir et al. |
| 2011/0201296 A1 | 8/2011 | Kaczman et al. |
| 2011/0230157 A1 | 9/2011 | Zhou et al. |
| 2011/0299575 A1 | 12/2011 | Aoulad Ali et al. |
| 2012/0002770 A1 | 1/2012 | Morita et al. |
| 2012/0015616 A1 | 1/2012 | Pratt et al. |
| 2012/0088532 A1 | 4/2012 | Thomas et al. |
| 2012/0238232 A1 | 9/2012 | Murphy et al. |
| 2012/0252374 A1 | 10/2012 | Mattisson et al. |
| 2013/0029626 A1 | 1/2013 | Chen et al. |
| 2013/0231124 A1 | 9/2013 | Vrzic et al. |

OTHER PUBLICATIONS

P. Rykaczewski, "Non-data-aided IQ imbalance compensation using measured receiver front-end signals", the 17th Annual IEEE Int. Sym on Personal, Indoor and Mobile Radio Com., 2006.

European Search Report, EP13159314.7, Jul. 22, 2013.

Giugno et al., "Efficient compensation of I/Q phase imbalance for digital receivers", 2005 IEEE International Conference on Communications, vol. 4, May 16, 2005, pp. 2462-2466.

European Search Report, EP13159316.2, Jul. 24, 2013.

* cited by examiner

IQ ERROR CORRECTION

CROSS-REFERENCE TO RELATED APPLICATIONS

This application is related to U.S. patent application Ser. No. 13/832,253; application Ser. No. 13/832,313; and application Ser. No. 13/832,649, each filed on even date herewith, which are incorporated herein in their entireties.

BACKGROUND

In radio receivers, IQ errors (or IQ imbalance) can cause the radio to exhibit a poor signal-to-noise ratio or exhibit errors. As modulation schemes become more complex utilizing larger numbers of constellation symbols, the radios become less tolerant of IQ errors. Hence, conventional techniques that set the radio's operational parameters at the time of manufacture or at the time of power up are inadequate to achieve adequate signal-to-noise ratio (SNR) in more complex modulation schemes.

BRIEF DESCRIPTION OF THE DRAWINGS

Example embodiments of the present disclosure will be described below with reference to the included drawings such that like reference numerals refer to like elements and in which:

FIG. 3, which is made up of FIG. 3*a* and FIG. 3*b* depicts phase and gain distortion in the I/Q space.

DETAILED DESCRIPTION

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The invention is not to be considered as limited to the scope of the embodiments described herein.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program" or "computer program" or "application" or similar terms, as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system. The term "processor", "controller", "CPU", "Computer" and the like as used herein encompasses both hard programmed, special purpose, general purpose and programmable devices and may encompass a plurality of such devices or a single device in either a distributed or centralized configuration without limitation.

Reference throughout this document to "one embodiment", "certain embodiments", "an embodiment", "an example", "an implementation", "an example" or similar terms means that a particular feature, structure, or characteristic described in connection with the embodiment, example or implementation is included in at least one embodiment, example or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples or implementations without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

This discussion addresses the problem of IQ imbalance (or errors) within radios. These IQ errors in a transceiver effectively contribute to the overall error vector magnitude (EVM) and SNR of a transceiver. IQ errors are usually primarily due to mismatches in the I and Q path in a transceiver and are generally a function of temperature, gain, and frequency bands/channels.

As noted above IQ errors (or IQ imbalance) in radio receivers can cause the radio to exhibit a poor signal-to-noise ratio or exhibit errors. As modulation schemes become more complex utilizing larger numbers of constellation symbols, the radios become less tolerant of IQ errors. Hence, conventional techniques that set the radio's operational parameters at the time of manufacture or at the time of power up are inadequate to achieve adequate signal-to-noise ratio (SNR). This problem is most evident when a particular modulation scheme dictates need for a SNR of greater than about 29 dB.

This problem is addressed in accord with the present teachings by changing the phase and gain error in the field in real time using communication signals rather than artificial test signals. The subset is measured for the level of radio performance in real time. In this case, the radio's performance can be a measure of the symmetry of the IQ plot. It should be noted that ideally all IQ plots are symmetrical about the I and Q-axis. The level of radio performance can thus be measured in of IQ symmetry.

Therefore, in accordance with certain aspects of the present disclosure, there is provided a method in which a radio receiver having first and second mixers that mix a received communication signal to produce quadrature I and Q signals, measuring an output value of the I and Q signals, a programmed processor is configured to carry out: evaluating symmetry in the I and Q signals by calculating a symmetry test value; iteratively testing gain and phase shift correction values by applying the gain and phase shift correction values to the I and Q signals to identify a pair of gain and phase shift correction values of the gain and phase shift correction values that produces an improved symmetry test value; selecting the pair of gain and phase shift correction values; and applying the pair of gain and phase shift correction values to the I and Q signals from the first and second mixers to generate a reduced amplitude and phase error in the output I and Q signals.

In certain implementations, the symmetry test value is equal to or proportional to:

$$\text{Symmetry\_test\_value} = \frac{\text{abs}(\langle II \rangle - \langle QQ \rangle) + \text{abs}(\langle IQ \rangle)}{(\langle II \rangle + \langle QQ \rangle)},$$

where $<>$ means average values. In certain implementations, the symmetry test value is equal to or proportional to: Symmetry_test_value=$<I>^2$-$<Q>^2$, where $<>$ means average values. In certain implementations, the symmetry test value is equal to or proportional to: Symmetry_phase=$<I*Q>$ where $<>$ means average values. In certain implementations, the gain and phase shift values are stored state variables that are tested to identify a pair of selected gain and phase shift correction values of the gain and phase shift correction values. In certain implementations, the gain and phase shift values are applied to signals from the first and second mixers by processing with a matrix multiplication with the selected pair of gain and phase shift correction values.

In another method, there is provided a radio receiver having first and second mixers that mix a received communication signal to produce quadrature I and Q signals, measuring an output value of the I and Q signals. A programmed processor is configured to carry out evaluating symmetry in the I and Q signals by calculating a symmetry test value, where the symmetry test value is equal to or proportional to:

$$\text{Symmetry\_test\_value} = \frac{\text{abs}(\langle II \rangle - \langle QQ \rangle) + \text{abs}(\langle IQ \rangle)}{(\langle II \rangle + \langle QQ \rangle)},$$

where $<>$ means average values; iteratively testing gain and phase shift correction values by applying the gain and phase shift values to the I and Q signals to identify a pair of gain and phase shift correction values of the gain and phase shift correction values that produces an improved symmetry test value; selecting the pair of gain and phase shift correction values, where the gain and phase shift values are stored state variables that are tested to identify the selected pair of gain and phase shift correction values; and applying the selected pair of gain and phase shift correction values to the I and Q signals from the first and second mixers.

In certain implementations, the gain and phase shift correction values are applied to signals from the first and second mixers by processing with a matrix multiplication with the gain and phase shift errors (pair of selected gain and phase shift correction values).

An example radio device has a radio receiver having first and second mixers that mix a received communication signal to produce quadrature I and Q signals, measuring an output value of the I and Q signals. A programmed processor is programmed to: evaluate symmetry in the I and Q signals by calculating a symmetry test value; iteratively test gain and phase shift correction values by applying the gain and phase shift values to the I and Q signals to identify a pair of gain and phase shift correction values of the gain and phase shift correction values that produces an improved symmetry test value; select the pair of gain and phase shift correction values; and apply the selected pair of gain and phase shift correction values to the I and Q signals from the first and second mixers to generate a reduced amplitude and phase error in the output value of the I and Q signals.

In certain implementations, the symmetry test value is equal to or proportional to:

$$\text{Symmetry\_test\_value} = \frac{\text{abs}(\langle II \rangle - \langle QQ \rangle) + \text{abs}(\langle IQ \rangle)}{(\langle II \rangle + \langle QQ \rangle)},$$

where $<>$ means average values. In certain implementations, the symmetry test value is equal to or proportional to: Symmetry_test_value=$<I>^2$-$<Q>^2$, where $<>$ means average values. In certain implementations, the symmetry test value is equal to or proportional to: Symmetry_phase=$<I*Q>$, where $<>$ means average values. In certain implementations, the gain and phase shift values are stored state variables that are tested to identify the selected gain and phase shift correction values. In certain implementations, the gain and phase shift values are applied to signals from the first and second mixers by processing with a matrix multiplication with the identified and selected gain and phase shift errors. In certain implementations, the gain and phase shift values are stored state variables that are tested to identify selected gain and phase shift values. In certain implementations, the gain and phase shift values are applied to signals from the first and second mixers by processing with a matrix multiplication with the identified and selected gain and phase shift errors. In certain implementations, the gain and phase shift values are stored state variables that are tested to identify the selected gain and phase shift values. In certain implementations, the gain and phase shift values are applied to signals from the first and second mixers by processing with a matrix multiplication with the identified and selected gain and phase shift errors. In certain implementations, the gain and phase shift values are stored state variables that are tested to identify the selected gain and phase shift correction values. In certain implementations, the gain and phase shift values are applied to signals from the first and second mixers by processing with a matrix multiplication with the identified and selected gain and phase shift errors.

Figure 1:
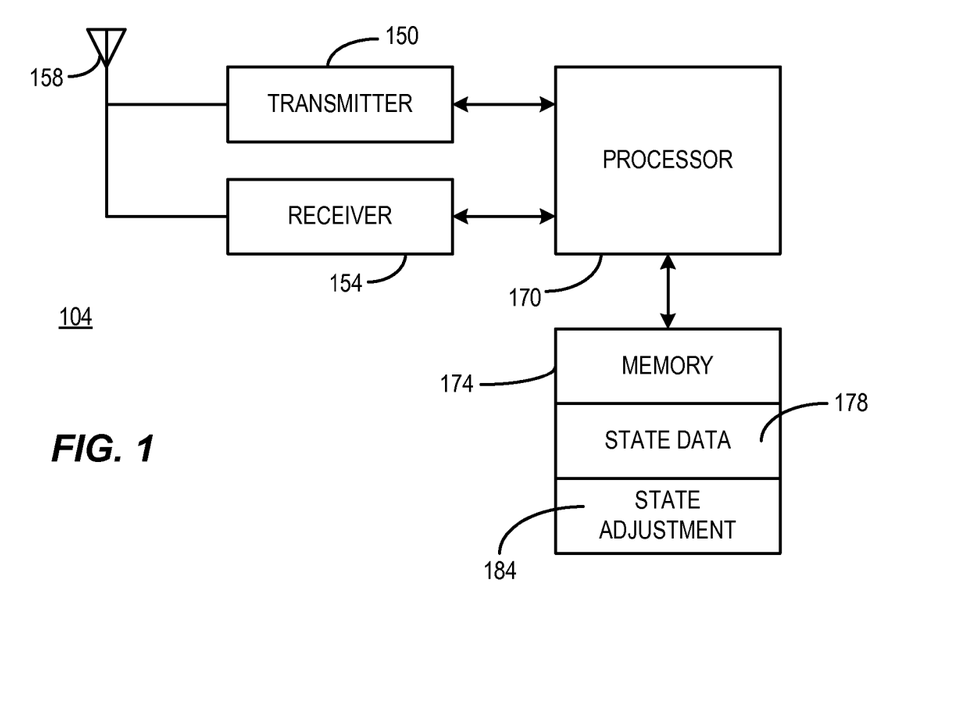
FIG. 1 is block diagram of an example radio transceiver consistent with certain embodiments.

FIG. 1 is an illustration of an example block diagram of a radio transceiver 104 example. This block diagram is simplified for clarity. In this example, radio transceiver 104 has a transmitter 150 and a receiver 154 that are operatively coupled to an antenna 158 for transmission and reception. Transmitter 150 and receiver 154 are controlled by one or more processors 170 that control operation of the radio and selection of the various state variables used to define operation of the various circuit elements making up transmitter 150 and receiver 154. Processor 170 utilizes memory 174 of any suitable type that stores state variable data 178 as well as various sets of instructions for control of the transceiver. One example set of instructions 184 implements functions that adjust the state variables used by the radio in the manner discussed herein in order to improve IQ symmetry.

Figure 2:
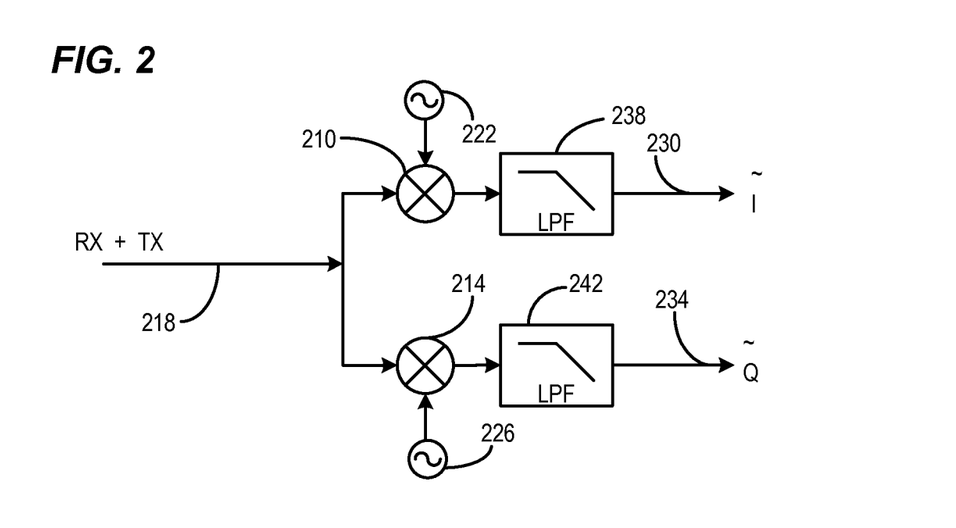
FIG. 2 is block diagram of an example of a portion of the radio receiver of radio 104.

With reference to FIG. 2, a block diagram of a portion of the receiver 154 is depicted. In the embodiment discussed herein, the radio receiver 154 has a pair of mixers 210 and 214 that produce outputs by mixing their input signal 218 with local oscillator signals 222 and 226 (which are 90 degrees out of phase) in order to produce quadrature I and Q output signals coming from the pair of mixers. These I and Q output signals are a product of mixing local oscillator signals with the input signal at 218 at mixers 210 and 214 to translate the I and Q signals down to baseband in a single conversion and are the signals that are decoded after filtering at low pass filters 238 and 242. At outputs 230 and 234 the output quadrature signals are designated Ĩ and Q̃ in order to indicate that this signal has magnitude and/or phase errors. While this discussion presumes a single conversion radio receiver, the present techniques are equally applicable to multiple conversion receivers.

In accord with certain implementations, the mixers 210 and 214 may have controllable parameters that can be adjusted directly or indirectly by a processor 170. Such controllable parameters can have an effect on the amount of errors in I and Q produced at the output of the mixers and hence at the output of the filters. Processor 170 operates based on instructions stored in a memory 174 that includes instructions 184 that estimate the I and Q errors and helps to minimize such errors. Hence, a method can be provided to estimate/measure the I and Q errors in the presence of a wanted signal during operation of the transceiver in the field. By taking this measurement, the IQ signal errors as measured by asymmetry of the IQ signals can be minimized using a closed loop approach.

In the example transceiver of FIG. 2 it would be desirable for the Ĩ signal 230 and the Q̃ signal 234 to be processed in the radio transceiver in order to carry out reception of a transmitted communication. Distortions created within the mixers and filters can cause the magnitude and phase of the Ĩ and Q̃ signals to deviate from ideal thus reducing the SNR (signal to noise ratio). As noted above, one measure of this error often shows up as an error in IQ symmetry.

Figure 3A:
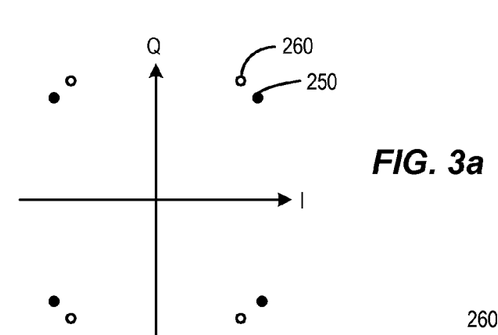
Figure 3B:
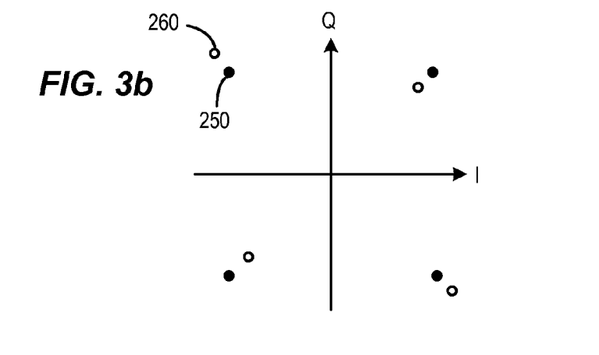

In an ideal receiver, the I and Q signals are symmetrical. This is illustrated in FIG. 3a and FIG. 3b by an ideal IQ plot for a four symbol system in which the solid dots such as 250 represent ideal locations of the four symbols in IQ space lying in a perfect circle. When there is gain error, as depicted in FIG. 3a, the magnitude of the symbols is shifted horizontally or vertically or both. In this case, this is represented by open dots such as 260 in which the gain in the Q direction is too large in magnitude and the gain in the I direction is too small in magnitude. In FIG. 3b, the phase error effects result in a shifting out of some symbols relative to the origin and shifting in of others. This causes the constellation to again be asymmetrical.

Figure 4:
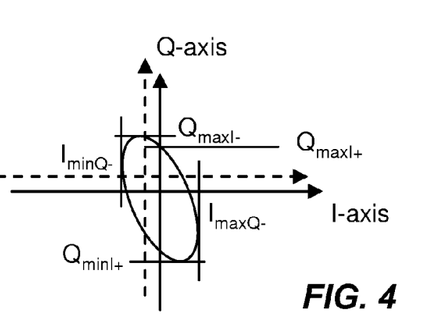
FIG. 4 is a depiction of gain and phase error in I/Q space from which symmetry calculations can be derived.

One method to define Symmetry is as follows, making reference to FIG. 4:

$Q_a$=average(Q); % effectively the DC offset of the Q-data over a number of samples;
$I_a$=average(I); % effectively the DC offset of the I-data over a number of samples;
$Q_{maxI+}$=maxI+(Q)−$Q_a$/2; %;
$I_{maxQ+}$=maxQ+(I)−$I_a$/2;;
$Q_{minI+}$=minI+(Q)−$Q_a$/2; %;
$I_{minQ+}$=minQ+(I)−$I_a$/2;%;
$Q_{maxI-}$=maxI−(Q)−$Q_a$/2;%;
$I_{maxQ-}$=maxQ−(I)−$I_a$/2; %;
$Q_{minI-}$=minI−(Q)−$Q_a$/2;%;
$I_{minQ-}$=minQ−(I)−$I_a$/2;%;
Norm=max$(Q_{maxI+},Q_{maxI-})^2$+min$(Q_{minI+},Q_{minI-})^2$+max$(I_{maxQ+},I_{maxQ-})^2$+min$(I_{minQ+},I_{minQ-})^2$; % this is normalized maximum;
Symmetry_test=$(|\max(Q_{maxI-},Q_{maxI+})|-|\min(Q_{minI-},Q_{minI+})|)^2$+$(|\min(Q_{maxI-},Q_{maxI+})|-|\max(Q_{minI-},Q_{minI+})|)^2$+$(|\max(I_{maxQ-},I_{maxQ+})|-|\min(I_{minQ-},I_{minQ+})|)^2$+$(|\min(I_{maxQ-},I_{maxQ+})|-|\max(I_{minQ-},I_{minQ+})|)^2$+$(\max(Q_{maxI-},Q_{maxI+})-\max(I_{maxQ+},I_{maxQ-}))^2$;
Symmetry_test=100*Symmetry_test/Norm; % the units are in the percentage. Ideally Symmetry_test=0%.

Generally speaking, the I and Q data will have an average value (i.e. the DC offset) and a spread. The standard deviation (or rms values) of the Q and I data should be equal if the data is symmetrical. This could also be used as a measure of symmetry; i.e.:

$$\text{Symmetry\_gain} = (\sigma_I)^2 - (\sigma_Q)^2 = \langle II \rangle - \langle QQ \rangle$$
$$= \langle I \rangle^2 - \langle Q \rangle^2. \quad \text{EQUATION 1}$$

Where $(\sigma_I)^2 - (\sigma_Q)^2$ is the difference in the average value of I and Q squared.

Furthermore, ideally the I and Q data should not be correlated.

Therefore another measure of symmetry is given by:

$$\text{Symmetry\_phase} = \langle I*Q \rangle. \quad \text{EQUATION 2}$$

In each case, the symmetry measurement is fully optimized (assuming no other distortions) when symmetry_gain and symmetry_phase are equal to zero.

Therefore, a complete measure of symmetry (both gain and phase) is given by (expressed as a percentage):

$$\text{Symmetry\_test} = \frac{\text{abs}(\langle II \rangle - \langle QQ \rangle) + \text{abs}(\langle IQ \rangle)}{(\langle II \rangle + \langle QQ \rangle)/2} \times 100$$

and hence, $$\text{Symmetry\_test} \propto \frac{\text{abs}(\langle II \rangle - \langle QQ \rangle) + \text{abs}(\langle IQ \rangle)}{(\langle II \rangle + \langle QQ \rangle)} \quad \text{EQUATION 3}$$

Where zero is again the optimum symmetry.

Hence, in accord with examples consistent with the present teachings, any of EQUATIONS 1, 2 or 3 can be utilized as a test for symmetry which can be minimized by variation of state variables to achieve improvement in IQ error distortion, with EQUATION 3 being the most comprehensive of the three tests.

Figure 5:
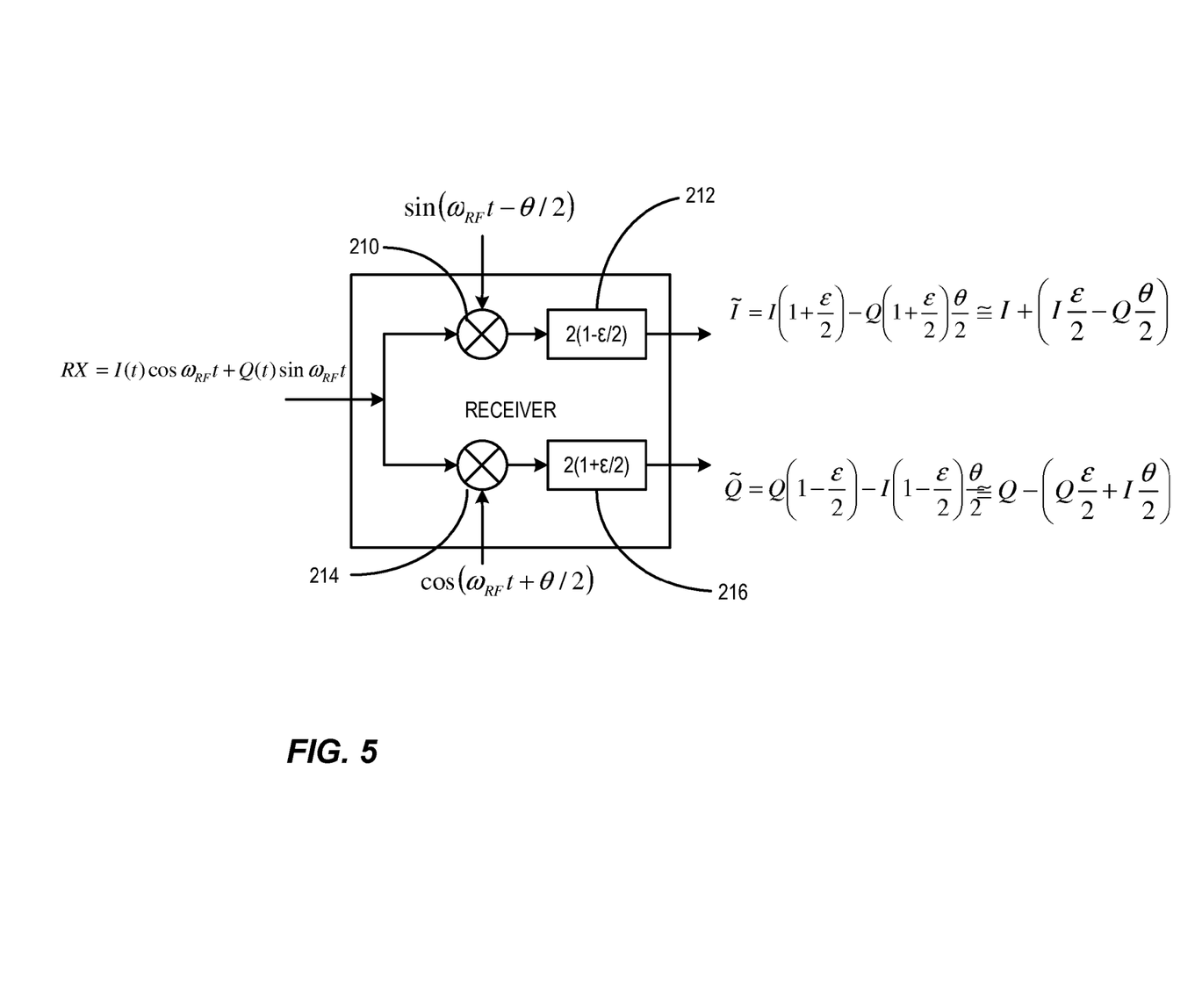
FIG. 5 is an example block diagram depicting a mixer model consistent with the present discussion.

Referring now to FIG. 5, the IQ imbalance can be modeled as a gain error $\epsilon$ and a phase error $\Theta$ that is induced by mismatches in the I and Q paths of the receiver. In this model, the mixers 210 and 214 are modeled by ideal mixers with gain stages 212 and 216 having gains $2(1-\epsilon/2)$ and $2(1-\epsilon/2)$ respectively. The phase shift is modeled in the oscillators as:
$\sin(\omega_{RF}t - \theta/2)$ and
$\cos(\omega t + \theta/2)$.
The input signal RX is modeled as:

$$RX = I(t)\cos\omega_{RF}t + Q(t)\sin\omega_{RF}t$$

resulting in output signals:

$$\tilde{I} = I\left[1+\frac{\varepsilon}{2}\right] - Q\left[1+\frac{\varepsilon}{2}\right]\frac{\theta}{2} \cong I + \left[I\frac{\epsilon}{2} - Q\frac{\theta}{2}\right]; \text{ and}$$

$$\tilde{Q} = Q\left[1-\frac{\varepsilon}{2}\right] - I\left[1-\frac{\varepsilon}{2}\right]\frac{\theta}{2} \cong Q - \left[Q\frac{\epsilon}{2} + I\frac{\theta}{2}\right].$$

Figure 6:
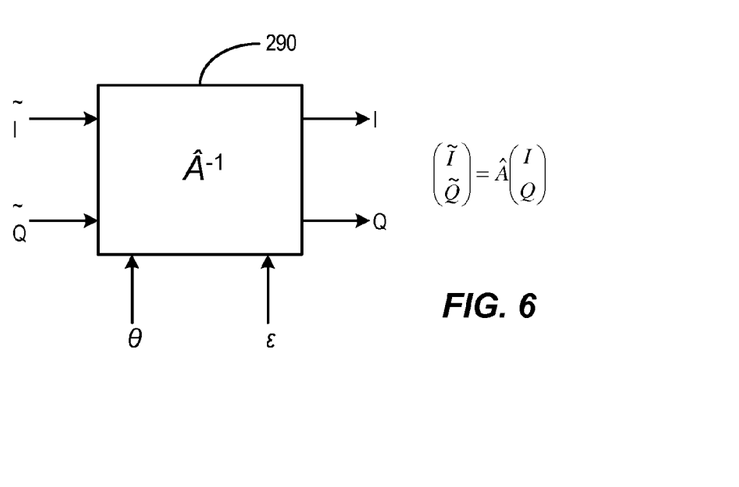
FIG. 6 is an example block diagram depicting an I/Q correction matrix.

Knowing this, and referring to FIG. 6, one can devise a signal processing arrangement 290 in which the error containing Ĩ and Q̃ signals in the receiver can be corrected. At the output of the mixers (and possibly filters) the Ĩ and Q̃ signals are processed by the processor 170 to implement a signal processor with transfer function in the form of a matrix multiplication $\hat{A}^{-1}$ which is derived from:

$$\begin{pmatrix} \tilde{I} \\ \tilde{Q} \end{pmatrix} = \hat{A} \begin{pmatrix} I \\ Q \end{pmatrix}.$$

EQUATION 4

Figure 7:
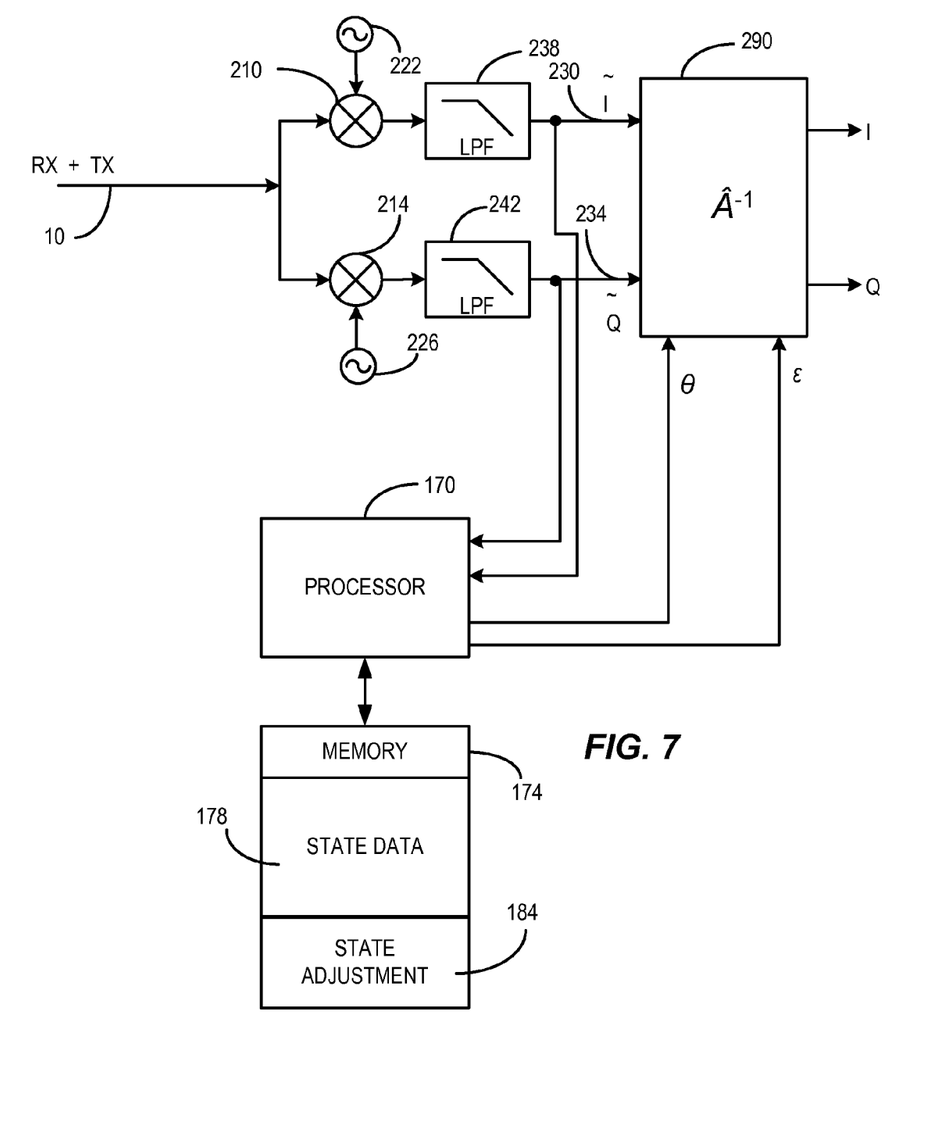
FIG. 7 is block diagram of a mixer correction implemented in a radio device in a manner consistent with the present discussion.

This can be implemented as shown in FIG. 7 using one or more programmed processors 170 in which a collection of symbols is analyzed and the value of one of the symmetry test equations above is tested to ascertain which stored or derived set of state variables produces a lowest or an adequately low level of I/Q distortion by virtue of reducing or minimizing the asymmetry of the I/Q data. This set of state variables ϵ and Θ are then established for use in processing the $\tilde{I}$ and $\tilde{Q}$ signals in processor 170 to implement a signal processor with transfer function in the form of a matrix multiplication $\hat{A}^{-1}$ so as to correct the $\tilde{I}$ and $\tilde{Q}$ signals to be closer to I and Q. As the values of state variables ϵ and Θ are incremented by processor 170, the value of a symmetry_value is evaluated to determine a minimum value or a value that is adequately low. The same real time communication signals $\tilde{I}$ and $\tilde{Q}$ signals can be used repeatedly by processor 170 in doing this evaluation if desired, or different real time communication signals can be used for each iteration.

Figure 8:
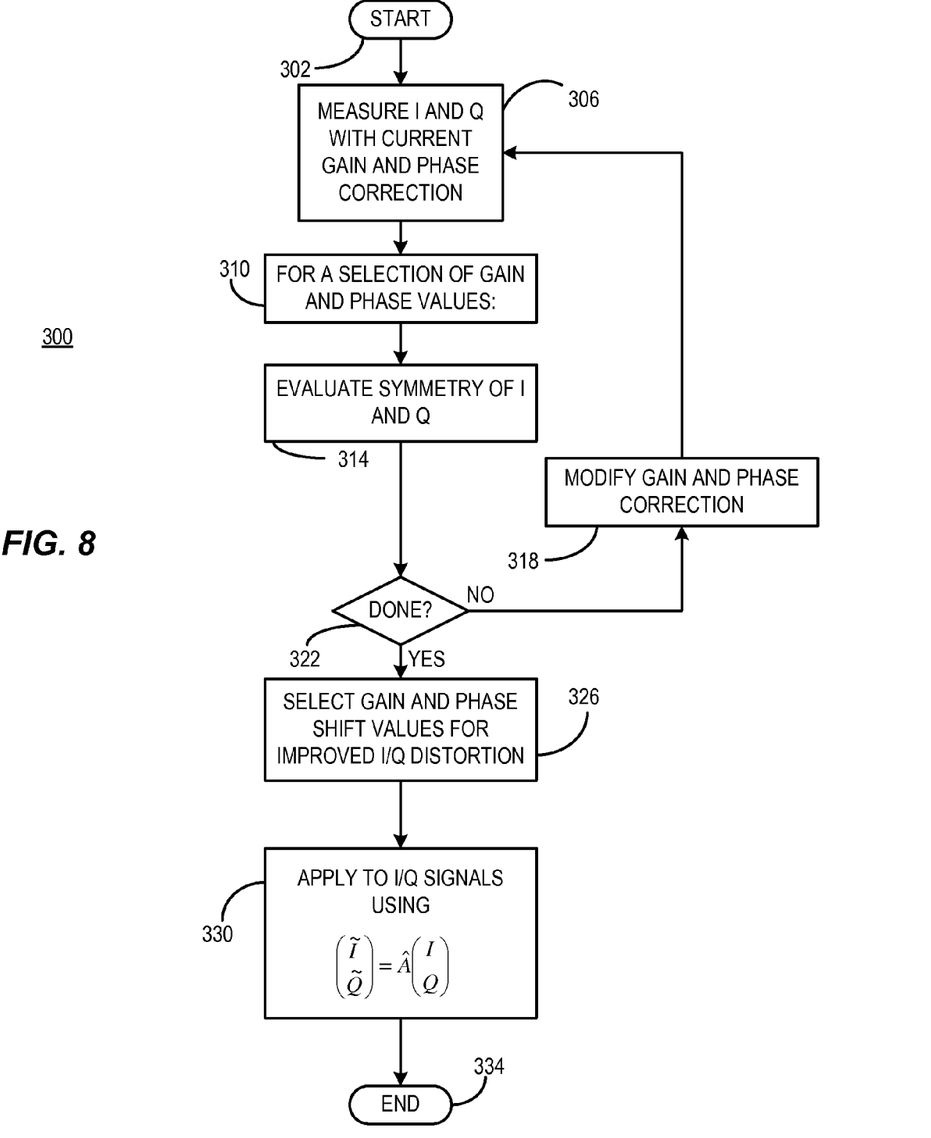
FIG. 8 is a flow chart of an example process consistent with the present teachings.

The example process just described can be expressed in an example flow chart of a process consistent with certain implementations shown as process 300 of FIG. 8. Starting at 302, the I and Q values are evaluated using the currently installed gain and phase shift parameters for the radio at 306. Then, for a selection of gain and phase values (e.g., all of the stored possible values, or a subset thereof surrounding the current values) at 310, a recursive process of evaluation of the symmetry of the I and Q data at 314 is carried out followed by modification of the gain and phase again at 318 until the selection of various gain and phase values is completed at 322. The same set of I and Q data can be used in each set of tests if desired when optimizing the symmetry.

Once the recursive test is completed, the gain and phase values are selected for improvement in IQ distortion at 326. Correction is then applied at 330 using the signal processing of 290 as discussed previously. The process ends at 334, but can be repeated at a later time or at periodic intervals to assure that IQ error remains acceptable.

The order in which the operations represented in FIG. 8 may vary in any operative order. Thus, while the blocks comprising the methods are shown as occurring in a particular order, it will be appreciated by those skilled in the art that many of the blocks may be interchangeable and can occur in different orders than that shown without materially affecting the end results of the methods.

The implementations of the present disclosure described above are intended to be examples only. Those of skill in the art can effect alterations, modifications and variations to the particular example embodiments herein without departing from the intended scope of the present disclosure. Moreover, selected features from one or more of the above-described example embodiments can be combined to create alternative example embodiments not explicitly described herein.

It will be appreciated that any module or component disclosed herein that executes instructions may include or otherwise have access to non-transitory and tangible computer readable media such as storage media, computer storage media, or data storage devices (removable or non-removable) such as, for example, magnetic disks, optical disks, or tape data storage, where the term "non-transitory" is intended only to exclude propagating waves and signals and does not exclude volatile memory or memory that can be rewritten. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the server, any component of or related to the network, backend, etc., or accessible or connectable thereto. Any application or module herein described may be implemented using computer readable/executable instructions that may be stored or otherwise held by such computer readable media.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. A method, comprising:
 in a radio receiver having first and second mixers that mix a received communication signal to produce quadrature I and Q signals, measuring an output value of the I and Q signals;
 at a programmed processor:
  evaluating symmetry in the I and Q signals by calculating a symmetry test value;
  iteratively testing gain and phase shift correction values by applying the gain and phase shift correction values to the I and Q signals to identify a pair of gain and phase shift correction values of the gain and phase shift correction values that produces an improved symmetry test value;
  selecting the pair of gain and phase shift correction values; and
  applying the pair of gain and phase shift correction values to the I and Q signals from the first and second mixers to generate a reduced amplitude and phase error in the output value of the I and Q signals.

2. The method according to claim 1, where the symmetry test value is equal to or proportional to:

$$\text{Symmetry\_test\_value} = \frac{\text{abs}(\langle II \rangle - \langle QQ \rangle) + \text{abs}(\langle IQ \rangle)}{(\langle II \rangle + \langle QQ \rangle)}$$

where < > means average values.

3. The method according to claim 1, where the symmetry test value is equal to or proportional to:

Symmetry_test_value=$<I>^2-<Q>^2$ where < > means average values.

4. The method according to claim 1, where the symmetry test value is equal to or proportional to:

Symmetry_phase=$<I*Q>$ where < > means average values.

5. The method according to claim 1, where the gain and phase shift correction values are stored state variables that are tested to identify the selected pair of gain and phase shift correction values.

6. The radio device according to claim 1, where the pair of gain and phase shift correction values are represented in a first matrix and the outputs of the first and second mixers are represented by a second matrix, and where gain and phase shift correction values are applied to the output values from the first and second mixers by performing a matrix multiplication of the first matrix with the second matrix.

7. A method, comprising:
   in a radio receiver having first and second mixers that mix a received communication signal to produce quadrature I and Q signals, measuring an output value of the I and Q signals;
   at a programmed processor:
      evaluating symmetry in the I and Q signals by calculating a symmetry test value, where the symmetry test value is equal to or proportional to:

$$\text{Symmetry\_test\_value} = \frac{\text{abs}(\langle II \rangle - \langle QQ \rangle) + \text{abs}(\langle IQ \rangle)}{(\langle II \rangle + \langle QQ \rangle)},$$

where $\langle\ \rangle$ means average values;
      iteratively testing gain and phase shift correction values by applying the gain and phase shift correction values to the I and Q signals to identify a pair of gain and phase shift correction values of the gain and phase shift correction values that produces an improved symmetry test value;
      selecting the pair of gain and phase shift correction values, where the gain and phase shift correction values are stored state variables that are tested to identify the selected pair of gain and phase shift correction values; and
      applying the selected pair of gain and phase shift correction values to the I and Q signals from the first and second mixers to generate a reduced amplitude and phase error in the output value of the I and Q signals.

8. The method according to claim 7, where the pair of gain and phase shift correction values are represented in a first matrix and the outputs of the first and second mixers are represented by a second matrix, and where gain and phase shift correction values are applied to the output values from the first and second mixers by performing a matrix multiplication of the first matrix with the second matrix.

9. A radio device, comprising:
   a radio receiver having first and second mixers that mix a received communication signal to produce quadrature I and Q signals, the radio receiver operable to measure an output value of the I and Q signals;
   a programmed processor that is programmed to:
      evaluate symmetry in the I and Q signals by calculating a symmetry test value;
      iteratively test gain and phase shift correction values by applying the gain and phase shift correction values to the I and Q signals to identify a pair of gain and phase shift correction values of the gain and phase shift correction values that produces an improved symmetry test value;
      select the pair of gain and phase shift correction values for reduced amplitude and phase error in the output I and Q signals; and
      apply the selected pair of gain and phase shift correction values to the I and Q signals from the first and second mixers to generate a reduced amplitude and phase error in the output value of the I and Q signals.

10. The radio device according to claim 9, where the symmetry test value is equal to or proportional to:

$$\text{Symmetry\_test\_value} = \frac{\text{abs}(\langle II \rangle - \langle QQ \rangle) + \text{abs}(\langle IQ \rangle)}{(\langle II \rangle + \langle QQ \rangle)}$$

where $\langle\ \rangle$ means average values.

11. The radio device according to claim 9, where the symmetry test value is equal to or proportional to:
   $\text{Symmetry\_test\_value} = \langle I \rangle^2 - \langle Q \rangle^2$ where $\langle\ \rangle$ means average values.

12. The radio device according to claim 9, where the symmetry test value is equal to or proportional to:
   $\text{Symmetry\_phase} = \langle I*Q \rangle$ where $\langle\ \rangle$ means average values.

13. The radio device according to claim 9, where the gain and phase shift correction values are stored state variables that are tested to identify the selected pair of gain and phase shift correction values.

14. The radio device according to claim 9, where the pair of gain and phase shift correction values are represented in a first matrix and the outputs of the first and second mixers are represented by a second matrix, and where gain and phase shift correction values are applied to the output values from the first and second mixers by performing a matrix multiplication of the first matrix with the second matrix.

15. The radio device according to claim 10, where the gain and phase shift correction values are stored state variables that are tested to identify the selected pair of gain and phase shift correction values.

16. The radio device according to claim 10, where the pair of gain and phase shift correction values are represented in a first matrix and the outputs of the first and second mixers are represented by a second matrix, and where gain and phase shift correction values are applied to the output values from the first and second mixers by performing a matrix multiplication of the first matrix with the second matrix.

17. The radio device according to claim 11, where the gain and phase shift correction values are stored state variables that are tested to identify the selected pair of gain and phase shift correction values.

18. The radio device according to claim 11, where the pair of gain and phase shift correction values are represented in a first matrix and the outputs of the first and second mixers are represented by a second matrix, and where gain and phase shift correction values are applied to the output values from the first and second mixers by performing a matrix multiplication of the first matrix with the second matrix.

19. The radio device according to claim 12, where the gain and phase shift correction values are stored state variables that are tested to identify the selected pair of gain and phase shift correction values.

20. The radio device according to claim 12, where the pair of gain and phase shift correction values are represented in a first matrix and the outputs of the first and second mixers are represented by a second matrix, and where gain and phase shift correction values are applied to the output values from the first and second mixers by performing a matrix multiplication of the first matrix with the second matrix.

* * * * *